United States Patent [19]

Maeda et al.

[11] 4,367,306

[45] Jan. 4, 1983

[54] POLYOLEFIN COMPOSITION

[75] Inventors: Masahiko Maeda, Tokyo; Naotochi Watanabe, Kawasaki; Kenji Fujitani, Yokohama, all of Japan

[73] Assignee: Showa Denko Kabushiki Kaisha, Tokyo, Japan

[21] Appl. No.: 361,959

[22] Filed: Mar. 25, 1982

[30] Foreign Application Priority Data

Mar. 27, 1981 [JP] Japan .................................. 56-43925

[51] Int. Cl.$^3$ .......................... C08K 3/08; C08K 3/16; C08K 3/10; C08K 3/04
[52] U.S. Cl. .................................. 524/411; 252/503; 252/508; 524/137
[58] Field of Search ......................................... 524/411

[56] References Cited

U.S. PATENT DOCUMENTS

| 3,474,067 | 10/1969 | Praetzel et al. | 524/411 |
| 3,668,281 | 6/1972 | Drake | 524/411 |
| 4,006,114 | 2/1977 | Carlson | 524/411 |
| 4,234,469 | 11/1980 | Ohta et al. | 524/411 |

*Primary Examiner*—Paul Lieberman
*Assistant Examiner*—Herbert J. Lilling
*Attorney, Agent, or Firm*—Sughrue, Mion, Zinn, MacPeak & Seas

[57] ABSTRACT

A polyolefin composition is described, comprising: (A) a polyolefin which is modified with an unsaturated carboxylic acid or its derivative, or a mixture of such a modified polyolefin and a polyolefin, (B) aluminum or aluminum alloy in a powdery, fibrous and/or flaky form, (C) electrically conductive carbon black, (D) a halogen-containing organic compound and antimony oxide, and (E) a hydrous inorganic substance. This polyolefin composition has good electromagnetic wave-shielding properties and flame resistance, and therefore, it can be used as a housing material for electronic equipment.

11 Claims, No Drawings

POLYOLEFIN COMPOSITION

FIELD OF THE INVENTION

The present invention relates to a polyolefin composition, and more particularly, to a polyolefin composition which is excellent particularly in properties of electromagnetic interference, and has good flame resistance.

BACKGROUND OF THE INVENTION

Radiation sources for electromagnetic waves have been increasing in number with a continued advances in industrial technology and the general standard of living. The leakage of electromagnetic waves, therefore, has become a significant social problem since it exerts adverse influences on human bodies. Such leakage may also cause the incorrect behavior of integrated circuits in electronic equipments. In particular, electromagnetic waves radiated from electronic computers and various office equipment exert adverse influences on television sets and audio equipments.

Various methods have been used recently to shield such equipments against electromagnetic waves.

In general, since metals can absorb or reflect electromagnetic waves, they are effectively used as shielding materials for electromagnetic waves radiated from an electronic oven and various communication apparatuses. In addition, plastics with metals vapor-deposited, wire spray coated, sprayed or plated thereon can be used for the same purpose. Furthermore, materials prepared by adding relatively large amounts of additives, e.g., carbon powder and metal powder, to plastics can be used.

Such methods of using metals as such or of applying treatments, e.g., vapor deposition of metals, on plastics are disadvantageous in that the specific gravity is large, workability is poor, the procedure of treatment is not simple, and the treatment cost is high. Similarly, the method of introducing additives is disadvantageous in that when these additives are added in small amounts, the effect cannot be exhibited sufficiently. However, when they are added in large amounts, the mechanical strength and workability of the resulting molded article are seriously reduced although the effect can be exhibited.

Polyolefin compositions comprising metal powders and polyolefin or modified polyolefin are proposed, which have minimized reduction in mechanical strength to the extent that the reduction does not become a substantial obstacle for practical use. In addition, the compositions have good workability. See, for example, British Pat. Nos. 1,073,567, 1,168,701, 1,195,076, 1,246,829 and 1,226,181 and U.S. Pat. Nos. 3,468,753, 3,491,056 and 3,393,257. These polyolefin compositions have advantageous properties of electromagnetic interference. However, when they are used as a housing material for home electric appliances, e.g., a video camera, a television, and a hair drier, or as office equipments, e.g., a facsimile, a micro-computer, a printer and a word-processor, they are required to have flame resistance as well as properties of electromagnetic interference.

In general, in order to increase the effect of electromagnetic interference of synthetic resins or rubbers, it is necessary to incorporate a large amount of electrically conductive carbon black. It is, however, very difficult to provide flame resistance to compositions containing large amounts of carbon black. Even though additives such as halogen-containing organic compounds and antimony oxide are added to provide flame resistance, when the resulting composition is exposed to a flame in accordance with a flame resistance testing method ("UL-94 Method", Underwriter Laboratories, U.S.A.), glowing due to carbonization of the carbon black is vigorous. Furthermore, the flame remains alive for a long period of time, and if other flammable substances are brought into contact with the flame, they will easily catch fire. Even if considerable amounts of flame retarders are added this tendency remains and it is quite difficult to eliminate these defects. Moreover, the addition of such large amounts of flame retarders to compositions with carbon black incorporated thereinto causes a reduction in the properties of electromagnetic interference since it results in a reduction in the proportion of carbon black, even if flame resistance can be provided. Therefore, it is not possible to obtain a polyolefin composition with good electromagnetic interference properties which also has excellent flame resistance. Furthermore, the use of such large amounts of expensive flame retarders gives rise increased costs. In addition, a molded article prepared from the composition does not have mechanical characteristics which are suitable for practical use.

SUMMARY OF THE INVENTION

A primary object of the invention is to provide a polyolefin composition free from the above-described defects, having excellent properties of electromagnetic interference and, at the same time, good flame resistance.

In accordance with this object, the present invention relates to a polyolefin composition comprising:
- (A) 90 to 40% by volume of a polyolefin modified with an unsaturated carboxylic acid and/or its derivative (hereinafter referred to as "modified polyolefin"), or a mixture of such a modified polyolefin and a polyolefin, wherein the unsaturated carboxylic acid and/or its derivative content of Component (A) is from 0.01 to 1.0% by weight;
- (B) 5 to 50% by volume of aluminum or an aluminum alloy in a powdery, fibrous and/or flaky form;
- (C) 5 to 50% by volume of electrically conductive carbon black, the proportions of Components (A), (B) and (C) being based on the total volume of Components (A), (B) and (C);
- (D) 5 to 30 parts by weight, per 100 parts by weight of Components (A), (B) and (C) above, of a halogen-containing organic compound and antimony oxide; and
- (E) at least 5 parts by weight, per 100 parts by weight of the carbon black, of a hydrous inorganic substance.

DETAILED DESCRIPTION OF THE INVENTION

The polyolefin composition of the invention has good properties with respect to electromagnetic interference as well as good flame resistance. Furthermore, it offers the following advantages:
- (1) Light weight;
- (2) Since the composition is thermoplastic, it can be molded into any desired form;
- (3) Mechanical characteristics such as bending strength and impact strength are good; and (4) Fabrication costs normally required for the shielding treatments of electromagnetic waves (e.g., wire spray coating, electrical coating or plating of metals) are not required, which greatly reduces costs.

The polyolefin composition of the invention can be used in a wide variety of applications due to its excellent characteristics as described above. Some typical uses are shown below:

(1) Housing materials for office equipment, such as a facsimile, a printer, and a word-processor;

(2) Housing materials for electronic equipment, such as a television set, a video system, and an electric computers, and interior parts therefor;

(3) Housing materials for control devices in connection with the engine power of a car, a meter display, a speed controller, a wiper-controlling unit, and a mirror-controlling unit; and (4) Prevention of noise for a car radio, a telephone, a television, and an illumination equipment.

The polyolefin composition of the invention will hereinafter be explained in detail.

(A) Modified Polyolefin

The modified polyolefin as used herein is prepared by modifying a polyolefin as defined hereinafter with an unsaturated carboxylic acid or its derivative.

Typical examples of unsaturated carboxylic acids or derivatives thereof which can be used include monobasic carboxylic acids containing at most 10 carbon atoms and at least one double bond, e.g., acrylic acid and methacrylic acid, dibasic carboxylic acids containing at most 15 carbon atoms and at least one double bond, e.g., maleic acid, and anhydrides of such dibasic carboxylic acids, e.g., maleic anhydride. Of these unsaturated carboxylic acids or derivatives thereof, maleic acid and maleic anhydride are particularly preferred.

The modified polyolefin is generally obtained by treating a polyolefin with an unsaturated carboxylic acid and/or its derivative in the presence of an organic peroxide.

Polyolefins which can be used include an ethylene homopolymer, a propylene homopolymer, an ethylene-propylene copolymer, a copolymer of ethylene and/or propylene with α-olefin containing at most 7 carbon atoms (the proportion of α-olefin is at most 20% by weight), and a copolymer of ethylene with a vinyl compound such as vinyl acetate, acrylates and methacrylates (the proportion of the vinyl compound is at most 50 mol%, preferably at most 40 mol%). The molecular weight of the polyolefin is usually from 20,000 to 1,000,000, preferably from 20,000 to 500,000, and particularly preferably from 50,000 to 300,000. Low density and high density ethylene homopolymers, a propylene homopolymer, an ethylene-propylene copolymer, and copolymers of ethylene or propylene and other α-olefins are preferred.

The modified polyolefin of the invention can be prepared by various known techniques, e.g., a solution method, a suspension method and a melt method, as described in British Pat. No. 1,073,567, U.S. Pat. No. 3,491,056 and *Encyclopedia of Polymer Science and Technology*, Vol. 6, p. 453 and Vol. 11, p. 616.

In modifying the polyolefin with the unsaturated carboxylic acid or derivative thereof by the solution method, the polyolefin and the unsaturated carboxylic acid or its derivative are introduced into a non-polar organic solvent. A radical initiator is added and the resulting mixture is heated at a high temperature to obtain the desired modified polyolefin. Non-polar organic solvents which have a boiling point of at least 30° C., particularly 40° C. or more, and a melting point of not more than 40° C., particularly not more than 30° C., are preferably used. Suitable examples of non-polar organic solvents include hexane, heptane, benzene, toluene, xylene, chlorobenzene, and tetrachlorobenzene. With regard to the radical initiator, the decomposition temperature to obtain a half-life period of one minute is preferably from 70° to 230° C. Preferred examples of radical initiators are organic peroxides such as 2,3-dimethyl-2,5-di(tert-butylperoxy)hexane, 2,5-dimethyl-2,5-di(tert-butylperoxy)hexyne-3, and benzoyl peroxide. The treatment temperature is a temperature at which the polyolefin used is dissolved, and it is usually from 110° to 160° C. and preferably from 130° to 150° C.

When the polyolefin is modified with unsaturated carboxylic acid or derivative thereof by the suspension method, the polyolefin and the unsaturated carboxylic acid or derivative thereof are introduced into a polar solvent (generally, water). A radical initiator as described above is then added and the mixture is treated under high pressure at a temperature of at least 100° C.

When the polyolefin is modified with unsaturated carboxylic acid or derivative thereof by the melt method, there is used a melt kneader (e.g., an extruder) which is generally used in the field of synthetic resins, into which the polyolefin, the unsaturated carboxylic acid or derivative thereof, and the radical initiator as described above are introduced. The mixture is then treated while melt-kneading. The kneading temperature is within the temperature range of from the melting point of the polyolefin to 300° C. However, the temperature varies depending on the type of polyolefin and radical initiator. In the case of polyethylene, the kneading temperature is usually from 120° to 270° C., and in the case of polypropylene, it is usually from 160° to 270° C.

In both cases where the modified polyolefin is used (no polyolefin is used) and a mixture of the modified polyolefin and a polyolefin is used, the amount of the unsaturated carboxylic acid and/or its derivative contained therein is from 0.01 to 1.0% by weight, preferably from 0.02 to 1.0% by weight.

(B) Aluminum or Aluminum Alloys in the Form of Powder or the Like

The mean size of the powdery aluminum or aluminum alloy is generally from 250 to 20 mesh. The diameter of the fibrous aluminum or aluminum alloy is generally from 0.0020 to 0.20 mm, and a fibrous aluminum or aluminum alloy having a length of 10 mm or less is preferred since it is easy to work with. In the case of flaky aluminum or aluminum alloy, it may be in any circular, triangular, square, rectangular, hexagonal or like form having a sectional area of from 0.1×0.1 mm to 5×5 mm. A flaky aluminum or aluminum alloy having a thickness of 0.1 mm or less is particularly preferred. In particular, a flaky aluminum or aluminum alloy having a square form with a sectional area of about 1×1 mm, and a thickness of about 0.03 mm has good dispersibility.

Of the powdery, fibrous and flaky aluminum or aluminum alloys, the flaky aluminum or aluminum alloy is preferred because it develops very little deformation and has good dispersibility during molding and remains in the flow direction of composition during processings, resulting in a high degree of electromagnetic interference; and it is not likely to fuse during processings.

The powdery, fibrous and flaky aluminum or aluminum alloys may be used alone. However, it is suitable to use them in combination with each other because the effect of the invention can be obtained at a low mixing ratio. The aluminum content of the aluminum alloy is usually at least 80% by weight.

(C) Carbon Black

The electrically conductive carbon black as used herein generally has a specific surface area of from 20 to 1,800 m$^2$/g, as determined by the low temperature nitrogen absorption method (see ASTM D 3037-78) and the BET method, and a pore volume of from 1.5 to 4.0 ml/g as determined by the mercuryl pressure-introduction method (see *Powder Technology*, Vol. 29 (1), pp. 45-52, 1981) within the pore diameter of from 30 to 7,500 Å. In particular, carbon black having a specific surface area of from 600 to 1,200 m$^2$/g can be effectively used in the invention.

The carbon black includes channel black, acetylene black, and carbon black produced by the furnace black method. Of these, carbon black produced by the furnace black method is particularly preferred because it has good dispersibility and does not reduce mechanical strength of the resulting composition. The method of production, physical properties, etc., of such carbon blacks are well known as described in Carbon Black Association ed., *Handbook of Carbon Black*, Tosho Shuppan, Tokyo (1972), *Handbook of Rubber/Plastic Compounding Chemicals*, Rubber Digest Co., Ltd., Japan (1974), and *Encyclopedia of Polymer Science and Technology*, Vol. 2, pp. 820-836.

(D) Halogen-Containing Organic Compound and Antimony Oxide

Halogen-containing organic compounds which are used in the invention are widely known as flame retarders. Of these flame retarders, those having a halogen content of from 20 to 80% by weight are preferred. In particular, those having a melting point of 200° C. or less and a boiling point of at least 300° C. are suitable. Preferred examples of such halogen-containing organic compounds are chlorine-containing compounds and bromine-containing compounds. Typical preferred examples are tetrachlorophthalic anhydride, chlorinated paraffin, chlorinated bisphenol A, brominated bisphenol S, chlorinated diphenyl, brominated diphenyl, chlorinated naphthalene, tris($\beta$-chloroethyl) phosphate and tris(dibromobutyl) phosphate.

The antimony oxide as used herein is generally used as a flame-retardant aid for the above-described halogen-containing organic compound. Preferred examples are antimony trioxide and antimony pentaoxide.

These halogen-containing organic compounds and antimony oxide are well known as described in the above described *Handbook of Rubber/Plastic Compounding Chemicals*.

(E) Hydrous Inorganic Substance

The hydrous inorganic substance as used herein has a bound water content of from 10 to 80% by weight and a true specific gravity of from 1.0 to 5.0. Hydrous inorganic substances capable of releasing water at 150° to 500° C., are preferably used for the purpose of the invention. Typical examples of such hydrous inorganic substances are hydrates of Group IIA, IIB and IIIB metals and salts containing such metals. Examples include compounds containing water in the molecules thereof, e.g., magnesium hydroxide, calcium hydroxide, aluminum hydroxide (Al$_2$O$_3$.nH$_2$O), hydrous gypsum, kaolin clay, calcium carbonate, hydrotalcite, basic magnesium carbonate, magnesium borate, and precipitating sulfate of barium, magnesium or calcium. These hydrous inorganic substances are insoluble in water, and the solubility in 100 ml of water at 20° C. is generally 10 g or less, preferably 1 g or less, and especially preferably 0.1 g or less. Preferred hydrous inorganic substances include aluminum hydroxide, hydrous gypsum, magnesium hydroxide, calcium carbonate, basic magnesium carbonate, and precipitating magnesium or calcium sulfate.

Composition Ratio (Mixing Ratio)

The proportions of the aluminum or aluminum alloy and the electrically conductive carbon black are from 5 to 50% by volume, respectively, based on the total volume of Components (A), (B) and (C). The total proportion of the above two components is from 10 to 60% by volume based on the total volume of Components (A), (B) and (C), with the range of from 25 to 50% by volume being particularly preferred. The volume ratio of the aluminum or aluminum alloy to the electrically conductive carbon black is suitably 2.5/1 to 1/2.5.

When electrically conductive carbon black having the shielding effect particularly within a high frequency region (MHz) and flaky aluminum having the shielding effect within a low frequency region (KHz) are used in combination, the shielding effect can be obtained over a much broader frequency region. Furthermore, even within regions where almost no shielding effect can be obtained when they are used alone, the shielding effect can be obtained significantly, indicating a synergistic effect. Although the exact reason why this effect is obtained is not clear, it is presumed that the electromagnetic energy reflected or absorbed by the aluminum or aluminum alloy in a powdery, fibrous or flaky form is grounded through the electrically conductive carbon black. This is supported by the fact that the use of electrically conductive carbon black in combination greatly increases the electrical conductivity of the polyolefin composition of the invention.

When the proportion of the total of the aluminum or aluminum alloy and electrically conductive carbon black is less than 10% by volume, no sufficient shielding effect can be obtained, particularly within a low frequency region. On the other hand, when the proportion is more than 60% by volume, the undesirable reduction in the moldability of the polyolefin composition occurs.

The total amount of the halogen-containing organic compound and antimony oxide being added is from 5 to 30 parts by weight, preferably from 10 to 30 parts by weight, and particularly preferably from 10 to 25 parts by weight, per 100 parts by weight of Components (A), (B) and (C). The proportion of the antimony oxide being compounded based on 100 parts by weight of the halogen element in the halogen-containing organic compound is generally from 100 to 600 parts by weight, and preferably from 100 to 400 parts by weight. In particular, from a standpoint of flame resistance and bleeding properties, it is preferred to be from 150 to 400 parts by weight.

One of the features of the invention resides in that the hydrous inorganic compound is added in an amount of at least 5 parts by weight, preferably from 7 to 20 parts by weight, per 100 parts by weight of the carbon black in order to provide good electrical conductivity and high flame resistance (V-0 according to the UL-94 method).

According to this invention, a rubbery material may be added in the polyolefin composition in order to increase the impact strength thereof. Rubbery materials which can be used have generally a Mooney viscosity of from 20 to 140, preferably from 30 to 120, more preferably from 40 to 100. Examples of rubbery materials include a chlorinated polyethylene having a chlorine content of 25 to 45 wt% produced by chlorination of an ethylene homopolymer or ethylene-α-olefin (containing at most 12 carbon atoms) copolymer which has a density of 0.92 to 0.98 g/cm$^3$ and a molecular weight of from 50,000 to 500,000, a butadiene homopolymer, a copolymer of butadiene and styrene or acrylonitrile which contains at least 65 wt% of butadiene, an ethylene-vinyl acetate copolymer containing 30 to 50 wt% of vinyl acetate, and an ethylene-propylene copolymer or ethylene-propylenediene terpolymer containing not more than 10% of diene wherein the weight ratio of ethylene to propylene is from 30/70 to 70/30. As the diene component, straight-chain or branched-chain olefins having 10 or less carbon atoms and having one or two terminal double bonds, and bicyclo[2,2,1]-hepten-2 which may be substituted with an alkyl group of 10 or less carbon atoms can be used. These rubbery materials are disclosed in *Encyclopedia of Polymer Science and Technology*, Vol. 2, pp. 678–754 and Vol. 6, pp. 359–384 and pp. 432–442. The rubbery material may be added in an amount of from 5 to 30 wt% based on Component (A).

Preparation of Composition, Molding Method, etc.

In preparing the polyolefin composition of the invention, it is also possible to add a compound which acts as a stabilizer against oxygen or heat, a metal degradation-preventing agent, a filler, and a lubricant which are generally used in the field of olefin-based resins.

The polyolefin composition of the invention can be prepared by dry blending using a mixer, such as a Henschel mixer, which is generally used in the field of polyolefin, or by melt kneading using a mixer, such as a Banbury mixer, a kneader, a roll mill and a screw type extruder. In addition, a uniform composition can be prepared by preliminarily performing dry blending and, thereafter, melt kneading the resulting composition (mixture). In this case, generally, the composition is, after melt kneading, molded into a pellet form and fed for subsequent molding.

Molding methods which can be used include an extrusion molding method, an injection molding method, and a press molding method. In addition, molding methods which are generally used in the field of polyolefin, such as a stamping method, a press molding method using an extruded sheet, and a vacuum molding method, can be used.

In both the melt kneading and molding, it is necessary to perform at temperatures higher than the softening points of the modified polyolefin and polyolefin. However, at higher temperatures than 250° C., the modified polyolefin and the polyolefin are sometimes subject to partial thermal degradation. Thus, the melt kneading and molding should be conducted at temperatures which are lower than 250° C. and furthermore, lower than the temperature at which the decomposition of the hydrous inorganic substance occurs and the bound water is released.

In preparing the polyolefin composition of the invention, the modified polyolefin may be used as it is, or the modified polyolefin and polyolefin may be previously mixed. The resulting composition (mixture) may be mixed with aluminum component, electrically conductive carbon black, halogen-containing organic compound and/or antimony oxide, and hydrous inorganic substance. Furthermore, all the components may be mixed together at the same time. Moreover, portions of the modified polyolefin, polyolefin, aluminum component, electrically conductive carbon black, halogen-containing organic compound and/or antimony oxide, and hydrous inorganic substances may be pre-mixed and used to prepare a master batch. In brief, the desired polyolefin composition of the invention can be prepared by uniformly mixing the components within the above-described proportion ranges.

For each Component (A), (B), (C), (D) or (E), one or more compounds may be used in preparation of the polyolefin composition of the invention.

The following Examples and Comparative Examples are given to illustrate the invention in greater detail.

In the examples and comparative examples, melt index (hereinafter referred to as "M.I.") was measured according to ASTM D 1238-79, Condition E. Melt flow index (hereinafter referred to as "M.F.I.") was measured according to ASTM D 1238-79, Condition L. The volume resistivity test was performed using a resistivity meter (trade name: Degital Multimeter TR-6856, produced by Takeda Riken Co., Ltd.), in which the resistivity of a 2 mm thick specimen was measured under a temperature of 25° C. and a relative humidity of 60%. The volume resistivity was calculated by the following equation:

$$\text{Volume Resistivity } (\Omega \cdot \text{cm}) = \frac{S \times R}{t}$$

wherein S represents the surface area of an electrode for measuring the volume resistivity, R represents the resistivity value of the specimen, and t represents the thickness of the specimen. The flame resistance was measured according to the UL-94 method, in which there was used a specimen having a thickness of $\frac{1}{8}$ inch, a length of 5 inches, and a width of $\frac{1}{2}$ inch. The electromagnetic wave-shielding effect was measured as follows:

A 3 mm thick sheet was used to make a 10×10×30 cm box, in which a portable signal generator adjusted in frequency to a predetermined level (600 MHz) was placed. The box was placed in a shielded room, and the electromagnetic wave from the signal generator was received by a receiving antenna and measured through a spectrum analyzer. Also, the electromagnetic wave from the signal generator which was not placed in the box was measured in the same manner as above. The ratio of the electric power when the signal generator was placed in the box to the electric power when the signal generator was not placed in the box was indicated in decibel (dB), and it was shown as the electromagnetic wave attenuation amount of the sheet. Larger electromagnetic wave attenuation amount indicates higher electromagnetic wave-shielding effect.

EXAMPLES 1 TO 6 AND COMPARATIVE EXAMPLES 1 TO 6

A mixture of 100 parts by weight of high density polyethylene (density: 0.960 g/cm$^3$; molecular weight: about 130,000) 0.01 part by weight of 2,5-dimethyl-2,5-di(butylperoxy)hexane (as a radical initiator), and maleic anhydride was previously dry-blended for 5 minutes using a Henschel mixer. The mixture was melt-kneaded in an extruder (diameter: 40 mm; resin temperature: 200° C.) to prepare a modified high density polyethylene (hereinafter referred to as "modified polyethylene"). The maleic anhydride content of the modified polyethylene was 0.6% by weight.

The thus prepared modified polyethylene, hexagonal aluminum flakes (sectional area: 1×1 mm; thickness: 0.03 mm), and, as electrically conductive carbon black, furnace black having a mean grain size of about 30 mµ (trade name: Vulcan XC-72, produced by Cabot Corp., U.S.A.; density: about 1.8 g/ml; surface area: 220 m²/g) were uniformly dry-blended for 5 minutes using a Henschel mixer. The resulting mixture was kneaded in an extruder (diameter: 40 mm; resin temperature: 200° C.) and pelletized to prepare a polyolefin composition. The proportions of the carbon black and the aluminum flakes in the polyolefin composition were 15% by volume, respectively.

To 100 parts by weight of the polyolefin composition were added 5 parts by weight of chlorinated paraffin (not added in the case of Comparative Example 1), antimony trioxide ($Sb_2O_3$) in the amount shown in Table 1, and alumina trihydrate having the gibbsite crystal structure ($Al_2O_3.3H_2O$) (true specific density: 2.42 g/ml; grain size: 3 to 20µ) in the amount shown in Table 1. The resulting mixture was sufficiently kneaded for 20 minutes by the use of an oven roll whose surface temperature was set at 150° C., and molded into a 3 mm thick sheet (Examples 1 to 3 and Comparative Examples 1 to 3) using an extruder (resin temperature: 180° C.).

TABLE 1

| | Amount (parts by weight) | |
|---|---|---|
| | $Sb_2O_3$ | $Al_2O_3.3H_2O$ |
| Example 1 | 10 | 15 |
| Example 2 | 15 | 15 |
| Example 3 | 20 | 15 |
| Comparative Example 1 | 0 | 15 |
| Comparative Example 2 | 15 | 0 |
| Comparative Example 3 | 20 | 0 |

In the same manner as in Example 1 except that polypropylene (density: 0.900 g/cm³; molecular weight: about 200,000) was used in place of polyethylene, a maleic anhydride-modified polypropylene was prepared (hereinafter referred to as "modified polypropylene"). The maleic anhydride content of the modified polypropylene was 0.6% by weight.

Subsequently, dry-blending was conducted in the same manner as in Example 1 except that 50 parts by volume of the above prepared modified polypropylene and 20 parts by volume of a propylene-ethylene block copolymer (ethylene content: 15% by weight; molecular weight: about 120,000) were used in place of the modified polyethylene. The thus prepared mixture was pelletized under the same conditions as in Example 1 except that the resin temperature was 230° C. to prepare a polyolefin composition. The proportions of the carbon black and the aluminum flakes were 15% by volume, respectively.

To 100 parts by weight of the polyolefin composition were added magnesium hydroxide ($Mg(OH)_2$; grain size: 0.2 to 5µ; surface area: 1.45 m²/g) in the amount shown in Table 2 (which was used in place of $Al_2O_3.3H_2O$ used in Example 1), $Sb_2O_3$ in the amount shown in Table 2, and 5 parts by weight of chlorinated paraffin (not added in the case of Comparative Example 4), and the resulting mixture was processed in the same manner as in Example 1 and molded into a sheet (Examples 4 to 6 and Comparative Examples 4 to 6) using a 5 oz. injection molding machine (resin temperature: 220° C.).

TABLE 2

| | Amount (parts by weight) | |
|---|---|---|
| | $Sb_2O_3$ | $Mg(OH)_2$ |
| Example 4 | 10 | 15 |
| Example 5 | 15 | 15 |
| Example 6 | 20 | 15 |
| Comparative Example 4 | 0 | 15 |
| Comparative Example 5 | 15 | 0 |
| Comparative Example 6 | 20 | 0 |

Each sheet thus obtained was measured in flame resistance, volume resistivity, and electromagnetic wave attenuation amount. The results are shown in Table 3.

TABLE 3

| | Flame Resistance | Volume Resistivity ($\Omega \cdot cm$) | Electromagnetic Attenuation Amount (dB) |
|---|---|---|---|
| Example 1 | V-0 | $6 \times 10^2$ | 35 |
| Example 2 | V-0 | $6 \times 10^2$ | 32 |
| Example 3 | V-0 | $6 \times 10^2$ | 27 |
| Comparative Example 1 | HB | $7 \times 10^2$ | 30 |
| Comparative Example 2 | V-2 | $5 \times 10^2$ | 35 |
| Comparative Example 3 | V-2 | $5 \times 10^2$ | 31 |
| Example 4 | V-0 | $1 \times 10^2$ | 31 |
| Example 5 | V-0 | $8 \times 10^2$ | 28 |
| Example 6 | V-0 | $8 \times 10^2$ | 26 |
| Comparative Example 4 | HB | $5 \times 10^2$ | 32 |
| Comparative Example 5 | V-2 | $5 \times 10^2$ | 34 |
| Comparative Example 6 | V-2 | $7 \times 10^2$ | 27 |

It is apparent from the results that the polyolefin composition of the invention not only has good radio wave or electromagnetic wave-shielding properties, but also is markedly improved in flame resistance compared with the comparative compositions not containing a hydrous inorganic substance of halogen-containing organic compound or antimony oxide.

EXAMPLE 7 AND COMPARATIVE EXAMPLE 7

In the same manner as in Example 4 except that the mixture of 30 parts by volume of the modified polypropylene produced in Example 4, 30 parts by volume of a polypropylene (density: 0.900 g/cm³; M.F.I.: 4.0 g/10 min) and 10 parts by volume of the propylene-ethylene block copolymer used in Example 4 was used as the polyolefin component, a polyolefin composition was prepared. The proportions of the carbon black and the aluminum flakes in the polyolefin composition were 15% by volume, respectively.

To 100 parts by weight of the polyolefin composition were added 15 parts by weight of $Mg(OH)_2$, 10 parts by weight of $Sb_2O_3$ and 5 parts by weight of chlorinated paraffin. The resulting mixture was processed in the same manner as in Example 4 and molded into a 3 mm thick sheet using a 5 oz. injection molding machine (resin temperature: 240° C.) (Example 7).

For comparison, the same procedures as in Example 7 were repeated to obtain a 3 mm thick sheet, except that the mixture of 80 parts by volume of the polypropylene and 20 parts by volume of the propylene-ethylene block copolymer was used as the polyolefin component (Comparative Example 7).

Each sheet thus obtained was measured in flame resistance, volume resistivity and electromagnetic wave attenuation amount as well as impact strength, flexural modulus and bending strength according to ASTM D 256 and D 790. The results are shown in Table 4. The sheet obtained in Example 4 was also measured in the same manner and the results are shown in Table 4.

TABLE 4

|  | Flame Resistance | Volume Resistivity ($\Omega \cdot cm$) | Electromagnetic Attenuation Amount (dB) | Impact Strength (kg · cm/cm-notched) | Flexural Modulus (kg/cm$^2$) | Bending Strength (kg/cm$^2$) |
| --- | --- | --- | --- | --- | --- | --- |
| Example 7 | V-0 | $3 \times 10^2$ | 32 | 4.2 | 32,000 | 272 |
| Comparative Example 7 | V-0 | $7 \times 10^2$ | 31 | 1.0 | 12,000 | 151 |
| Example 4 | V-0 | $1 \times 10^3$ | 31 | 6.2 | 23,000 | 208 |

As is clear from the results, the addition of the modified polyolefin markedly improves the mechanical strength of the polyolefin composition.

COMPARATIVE EXAMPLES 8 AND 9

In the same manner as in Example 7 polyolefin compositions were prepared, except that no aluminum flakes were added (Comparative Example 8) and no carbon black was added (Comparative Example 9). In the same manner as in Example 4, Mg(OH)$_2$, Sb$_2$O$_3$ and chlorinated paraffin were added to each polyolefin composition obtained above and the resulting mixture was processed and molded into a sheet.

Each sheet was measured in flame resistance, volume resistivity and electromagnetic wave attenuation amount, and the results are shown in Table 5.

TABLE 5

|  | Flame Resistance | Volume Resistivity ($\Omega \cdot cm$) | Electromagnetic Attenuation Amount (dB) |
| --- | --- | --- | --- |
| Comparative Example 8 | V-0 | $5 \times 10^3$ | 8 |
| Comparative Example 9 | V-0 | $2 \times 10^4$ | 11 |

It is clearly seen from the results that when carbon black and aluminum flakes are used independently, satisfactory improvement in the electromagnetic interference cannot be achieved, whereas the combination use of carbon black and aluminum flakes as per the invention markedly improves the properties of electromagnetic interference as shown in Example 4.

While the invention has been described in detail and with reference to specific embodiments thereof, it will be apparent to one skilled in the art that various changes and modifications can be made therein without departing from the spirit and scope thereof.

What is claimed is:

1. A polyolefin composition comprising:
   (A) 90 to 40% by volume of a polyolefin which is modified with an unsaturated carboxylic acid and/or its derivative, wherein the unsaturated carboxylic acid and/or its derivative content of Component (A) is from 0.01 to 1.0% by weight;
   (B) 5 to 50% by volume of aluminum or an aluminum alloy;
   (C) 5 to 50% by volume of electrically conductive carbon black, the proportions of Components (A), (B), and (C) being based on the total volume of Components (A), (B) and (C);
   (D) 5 to 30 parts by weight, per 100 parts by weight of Components (A), (B) and (C), of a halogen-containing organic compound and antimony oxide; and
   (E) at least 5 parts by weight, per 100 parts by weight of the carbon black, of a hydrous inorganic substance.

2. A polyolefin composition comprising:
   (A) 90 to 40% by volume of a mixture of a polyolefin and a polyolefin modified with an unsaturated carboxylic acid and/or its derivative, wherein the unsaturated carboxylic acid and/or its derivative content of Component (A) is from 0.01 to 1.0% by weight;
   (B) 5 to 50% by volume of an aluminum or aluminum alloy;
   (C) 5 to 50% by volume of electrically conductive carbon, the proportions of Components (A), (B) and (C) being based on the total volume of Components (A), (B) and (C);
   (D) 5 to 30 parts by weight per 100 parts by weight of Components (A), (B) and (C), of a halogen-containing organic compound and antimony oxide; and
   (E) at least 5 parts by weight, per 100 parts by weight of the carbon black, of a hydrous inorganic substance.

3. A polyolefin composition as claimed in claim 1 or 2, wherein the aluminum or aluminum alloy is in a powdery form, a fibrous form, or a flaky form.

4. A polyolefin composition as claimed in claim 1, wherein the unsaturated carboxylic acid or its derivative is selected from the group consisting of maleic acid and maleic anhydride.

5. A polyolefin composition as claimed in claim 1 or 2, wherein the polyolefin has a molecular weight of from 20,000 to 1,000,000.

6. A polyolefin composition as claimed in claim 5, wherein the polyolefin has a molecular weight of from 20,000 to 500,000.

7. A polyolefin composition as claimed in claim 6, wherein the polyolefin has a molecular weight of from 50,000 to 300,000.

8. A polyolefin composition as claimed in claim 1 or 2, wherein the total proportion of Components (B) and (C) ranges from 10 to 60% by volume based on the total volume of Components (A), (B) and (C).

9. A polyolefin composition as claimed in claim 8, wherein the total proportion of Components (B) and (C) ranges from 25 to 50% by volume.

10. A polyolefin composition as claimed in claim 1 or 2, wherein the volume ratio of Components (B) to (C) ranges from 2.5/1 to 1/2.5.

11. A polyolefin composition as claimed in claim 1 or 2, wherein the proportion of Component (E) ranges from 7 to 20 parts by weight.

* * * * *